United States Patent
Kuang

(10) Patent No.: US 11,111,574 B2
(45) Date of Patent: Sep. 7, 2021

(54) VAPOR DEPOSITION APPARATUS AND VAPOR DEPOSITION METHOD

(71) Applicant: Shenzhen China Star Optoelectronics Technology Co., Ltd., Shenzhen (CN)

(72) Inventor: Youyuan Kuang, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 208 days.

(21) Appl. No.: 16/313,004

(22) PCT Filed: Sep. 14, 2018

(86) PCT No.: PCT/CN2018/105652
§ 371 (c)(1),
(2) Date: Dec. 21, 2018

(87) PCT Pub. No.: WO2019/227770
PCT Pub. Date: Dec. 5, 2019

(65) Prior Publication Data
US 2019/0360089 A1 Nov. 28, 2019

(51) Int. Cl.
*C23C 14/26* (2006.01)
*H01L 51/00* (2006.01)
*H01L 51/56* (2006.01)
*C23C 14/24* (2006.01)

(52) U.S. Cl.
CPC ............ *C23C 14/26* (2013.01); *C23C 14/243* (2013.01); *H01L 51/001* (2013.01); *H01L 51/56* (2013.01)

(58) Field of Classification Search
None
See application file for complete search history.

(56) References Cited

U.S. PATENT DOCUMENTS

2018/0034005 A1* 2/2018 Kuang .................. C23C 14/542
2018/0044776 A1* 2/2018 Liu ......................... C23C 14/12

FOREIGN PATENT DOCUMENTS

| CN | 105401125 A | 3/2016 |
| CN | 105603365 A | 5/2016 |
| CN | 106148899 A | 11/2016 |

OTHER PUBLICATIONS

Machine translation of CN106148899A (Year: 2021).*

* cited by examiner

Primary Examiner — Joel G Horning
(74) Attorney, Agent, or Firm — Leong C. Lei

(57) ABSTRACT

The invention provides a vapor deposition apparatus, comprising: a heating source, a crucible lid, a first crucible, a second crucible, a moving part, and a bracket. The first and second crucibles and moving part are disposed under the crucible lid; the first crucible is fixed on the bracket; and the first crucible and the second crucible each comprises an inner sidewall, an outer sidewall and a bottom. The crucible lid is mounted on the outer sidewall of the first crucible, the second crucible is fixed to top surface of the moving part; projection of the inner sidewall of the first crucible in vertical direction is located outside the outer sidewall of the second crucible. The density of the heating wire in the first region corresponding to the position of the crucible lid and the first crucible is greater than the density of the second region below the first region.

8 Claims, 19 Drawing Sheets

VAPOR DEPOSITION APPARATUS AND VAPOR DEPOSITION METHOD

BACKGROUND OF THE INVENTION

1. Field of the Invention

The present invention relates to the field of display manufacturing, and in particular to vapor deposition apparatus and vapor deposition method.

2. The Related Arts

The panel display device provides many advantages, such as, thinness, power saving, no radiation, and has been widely used. The existing panel display devices mainly include liquid crystal displays (LCD) and organic light-emitting displays (OLED). Compared with LCD, OLED display device not only provides excellent display performance, but also has the advantages of all solid state, self-illumination, simple structure, ultra-thin, fast response, wide viewing angle, room temperature operation, low power consumption and easy to realize flexible display and 3D display, and is known as "fantasy display", as well as consistently recognized as the mainstream technology of the next generation display, and has been favored by major display manufacturers.

The OLED display device generally comprises an anode, a cathode, and an organic electroluminescent material layer sandwiched between the anode and the cathode. The organic electroluminescent material layer further comprises a hole injection layer, a hole transport layer, a light-emitting layer, an electron transport layer, and an electron injection layer. The light-emitting mechanism of the OLED display device is to inject electrons and holes from the cathode and the anode respectively, and the injected electrons and holes are recombined in the light-emitting layer to excite the light-emitting layer molecules to generate singlet excitons, and the singlet excitons radiate and decay to emit light.

At present, the mainstream approach to prepare the OLED display devices is vacuum heating coating, i.e., heating the OLED material in a vacuum chamber to sublimate or melt and evaporate at a certain temperature, and deposit the OLED material through openings in the metal mask onto the substrate.

Refer to FIG. 1 and FIG. 2. A known vapor deposition crucible comprises a crucible body 100 and a heating wire 200 sleeved on outer side of the crucible body 100. The top of the crucible body 100 is provided with an opening 110. In use, the crucible body 100 is heated by the heating wire 200 so that the vapor deposition material in the crucible body 100 evaporates and is discharged from the opening 110. Since the evaporation material is generally a heat non-conductor, the crucible body 100 has a temperature difference in the radial direction when heated, and the lower the temperature of the region closer to the axial center of the crucible body 100, which will cause uneven heating for the vapor deposition material in the crucible body 100 and blocking the opening. At the same time, since a steady rate at which the evaporation material is discharged from the opening 110 at the top of the crucible body 100 must be maintained, the temperature at the opening 110 must be ensured preferably. Therefore, the crucible body 100 also generates a temperature difference in the axial direction. The temperature at the top of the crucible body 100 is higher than the temperature at the bottom, which causes the evaporation material located at the bottom of the crucible body 100 to evaporate when reaching the evaporation temperature and degrade when passing through the top region of the crucible body 100 as the temperature exceeds the material pyrolysis temperature. As such, a part of the evaporation material was wasted.

SUMMARY OF THE INVENTION

The object of the present invention is to provide a vapor deposition apparatus, capable of improving the utilization rate of a vapor deposition material, reducing a radial temperature difference in the vapor deposition apparatus, and improving the heat uniformity of the vapor deposition material in the vapor deposition apparatus.

Another object of the present invention is to provide a vapor deposition method, capable of improving the utilization rate of a vapor deposition material, reducing a radial temperature difference in the vapor deposition apparatus, and improving the heat uniformity of the vapor deposition material in the vapor deposition apparatus.

To achieve the above object, the present invention provides a vapor deposition apparatus, which comprises: a cylindrical heating source, a crucible lid housed in the heating source, a first crucible, a second crucible, a moving part, and a bracket;

the first crucible, the second crucible and the moving part being respectively disposed under the crucible lid; the first crucible being fixed on the bracket; the first crucible and the second crucible each comprising an inner sidewall, an outer sidewall disposed on outside of the inner sidewall, and a bottom connecting the inner sidewall and the outer sidewall and located at an end away from the crucible lid; the crucible lid being mounted on the outer sidewall of the first crucible, and an opening being provided at center of the crucible lid, a gap in vertical direction existing between an end of the inner sidewall of the first crucible near the crucible lid and the crucible lid; height of the outer sidewall of the first crucible being greater than or equal to height of the inner sidewall; the second crucible being fixed to top surface of the moving part; projection of the inner sidewall of the first crucible in vertical direction being located outside the outer sidewall of the second crucible;

the heating source comprising a cylindrical casing and a heating wire sleeved on the casing, the casing having a first region corresponding to position of the crucible lid and the first crucible and a second region located below the first region; density of the heating wire in the first region being greater than the density of the heating wire in the second region.

Preferably, the vapor deposition apparatus further comprises a third crucible housed in the heating source;

the third crucible is disposed under the crucible lid; the third crucible comprises an inner sidewall, an outer sidewall disposed outside the inner sidewall, and a bottom connecting the inner sidewall and the outer sidewall and located at an end away from the crucible lid; the projection of the inner sidewall of the first crucible in vertical direction is located outside the outer sidewall of the third crucible; projection of the inner sidewall of the third crucible in vertical direction is located outside the outer sidewall of the second crucible; a first limiting portion is disposed at bottom portion of inner surface of the inner sidewall of the first crucible, a second limiting portion is disposed at top portion of outer surface of the outer sidewall of the third crucible, projections of the first limiting portion and the second limiting portion in vertical direction at least partially overlap, the first limiting portion is located below the second limiting portion; the bottom portion of the inner surface of the inner sidewall of the third crucible is provided with an elastic limiting unit, projection of the elastic limiting unit in vertical direction at least partially overlaps with projection of the outer sidewall of the second crucible in vertical direction; when a gap existing between an end of the third crucible near the crucible lid and the crucible lid and the outer sidewall of the second crucible is located in below the elastic limiting unit, the moving part is moved upward, the outer sidewall of the second crucible pushes the elastic limiting unit of the third crucible to raise the third crucible; when the end of the third crucible near the crucible lid contacts the crucible lid and the outer sidewall of the second crucible is located below the elastic limiting unit, the moving part is moved upward, and the outer sidewall of the second crucible compresses the elastic limiting unit to move into inside of the inner sidewall of the third crucible.

Preferably, the inner sidewalls and the outer sidewalls of the first crucible and the second crucible are both cylindrical; the axes of the inner sidewall and the outer sidewall of the second crucible are coincident with the axes of the inner sidewall and the outer sidewall of the first crucible.

Preferably, the inner sidewalls and the outer sidewalls of the first crucible, the second crucible and the third crucible are all cylindrical; the axes of the inner sidewall of the outer sidewall of the second crucible, the axes of the inner sidewall and the outer sidewall of the first crucible are coincident with the axes of the inner sidewall and the outer sidewall of the third crucible.

Preferably, the shape of the crucible lid is round.

Preferably, the casing is cylindrical and axis of the casing coincides with the axis of the inner sidewall of the first crucible.

Preferably, the opening is disposed correspondingly to the axis of the inner sidewall of the first crucible.

Preferably, a groove is disposed corresponding to the elastic limiting unit at the bottom surface of the inner surface of the inner sidewall of the third crucible; the elastic limiting unit comprises a spring disposed in the corresponding groove and a protruding portion contacting an end of the spring away from bottom of the groove and exposed outside the groove; an end of the protruding portion away from the bottom of the groove is a circular arc surface;

projection of the protruding portion in vertical direction at least partially overlaps with the projection of the outer sidewall of the second crucible in vertical direction; when a gap existing between an end of the third crucible near the crucible lid and the crucible lid and the outer sidewall of the second crucible is located in below the elastic limiting unit, the moving part is moved upward, the outer sidewall of the second crucible pushes the circular arc surface at the end of the protruding portion away from the bottom of the groove to raise the third crucible; when the end of the third crucible near the crucible lid contacts the crucible lid and the outer sidewall of the second crucible is located below the elastic limiting unit, the moving part is moved upward, and the outer sidewall of the second crucible pushes the circular arc surface at the end of the protruding portion away from the bottom of the groove to compresses the spring to move the protruding portion towards the bottom of the groove so that the second crucible moves to inside the inner sidewall of the third crucible.

Preferably, the moving part is a piston, and a lower surface of the piston is provided with a rod.

The present invention also provides a vapor deposition method, applicable to the above-described vapor deposition apparatus, which comprises:

Step S1: placing a vapor deposition material in the first crucible and the second crucible, and moving the moving part to position the second crucible under the first crucible;

Step S2: energizing the heating wire, the heating wire heating the vapor deposition material in the first crucible to evaporate and discharging through the opening, and the heating wire preheating the vapor deposition material in the second crucible;

Step S3: after all the vapor deposition materials in the first crucible evaporated, continuing energizing the heating wire, and the moving the moving part upward to position the second crucible located in the inner side of the first crucible, and the heating wire heating the vapor deposition material in the second crucible to evaporate and discharge through the opening.

The present invention provides the following advantages: the present invention provides a vapor deposition apparatus comprising a heating source, a crucible lid, a first crucible, a second crucible, a moving part, and a bracket. The first crucible, the second crucible and the moving part are respectively disposed under the crucible lid; the first crucible is fixed on the bracket; and the first crucible and the second crucible each comprises an inner sidewall, an outer sidewall disposed on outside of the inner sidewall, and a bottom connecting the inner sidewall and the outer sidewall and located at an end away from the crucible lid. The crucible lid is mounted on the outer sidewall of the first crucible, the second crucible is fixed to top surface of the moving part; projection of the inner sidewall of the first crucible in vertical direction is located outside the outer sidewall of the second crucible. The density of the heating wire of the heating source in the first region corresponding to the position of the crucible lid and the first crucible is greater than the density of the second region below the first region. The vapor deposition apparatus can effectively improve the utilization rate of the vapor deposition material, and can effectively reduce the radial temperature difference in the vapor deposition apparatus and improve the heat uniformity of the vapor deposition material in the vapor deposition apparatus. The vapor deposition method provided by the invention can effectively improve the utilization rate of the vapor deposition material, and can effectively reduce the radial temperature difference in the vapor deposition apparatus and improve the heat uniformity of the vapor deposition material in the vapor deposition apparatus.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
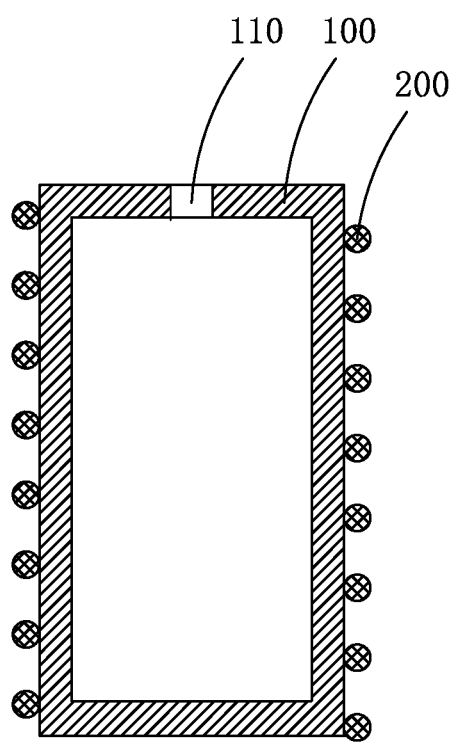
FIG. 1 is a cross-sectional view showing a known crucible for vapor deposition.
Figure 2:
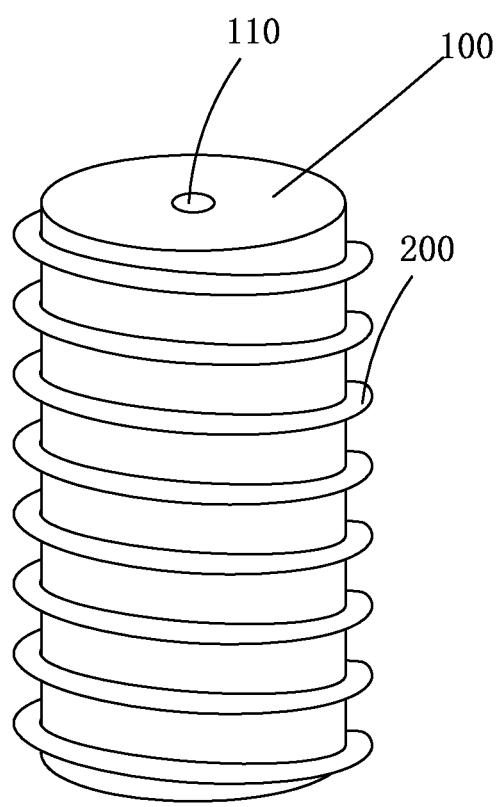
FIG. 2 is a schematic view showing a known crucible for vapor deposition.

To further explain the technical means and effect of the present invention, the following refers to embodiments and drawings for detailed description.

Refer to FIGS. 3-6. The first embodiment of the vapor deposition apparatus of the present invention comprises: a cylindrical heating source 10, a crucible lid 20 housed in the heating source 10, a first crucible 30, a second crucible 40, a moving part 50, and a bracket 80.

The first crucible 30, the second crucible 40 and the moving part 50 are respectively disposed under the crucible lid 20. The first crucible 30 is fixed on the bracket 80. The first crucible 30 and the second crucible 40 each comprises an inner sidewall, an outer sidewall disposed on outside of the inner sidewall, and a bottom connecting the inner sidewall and the outer sidewall and located at an end away from the crucible lid 20. The crucible lid 20 is mounted on the outer sidewall of the first crucible 30, and an opening 21 is provided at center of the crucible lid 20. A gap in vertical direction exists between an end of the inner sidewall of the first crucible 30 near the crucible lid 20 and the crucible lid 20. Height of the outer sidewall of the first crucible 30 is greater than or equal to height of the inner sidewall; the second crucible 40 is fixed to top surface of the moving part 50. Projection of the inner sidewall of the first crucible 30 in vertical direction is located outside the outer sidewall of the second crucible 40.

The heating source 10 comprises a cylindrical casing 11 and a heating wire 12 sleeved on the casing 11, and the casing 11 has a first region 111 corresponding to position of the crucible lid 20 and the first crucible 30 and a second region 112 located below the first region 111. Density of the heating wire 12 in the first region 111 is greater than the density of the heating wire 12 in the second region 112.

Specifically, the bracket 80 may be disposed in the heating source 10 or may be disposed outside the heating source 10 as long as the first crucible 30 can be fixed. The shape of the bracket 80 may be any shape. In the embodiment shown in FIGS. 3 and 4, the bracket 80 is disposed in the heating source 10 and is a rod-shaped bracket.

Figure 3:
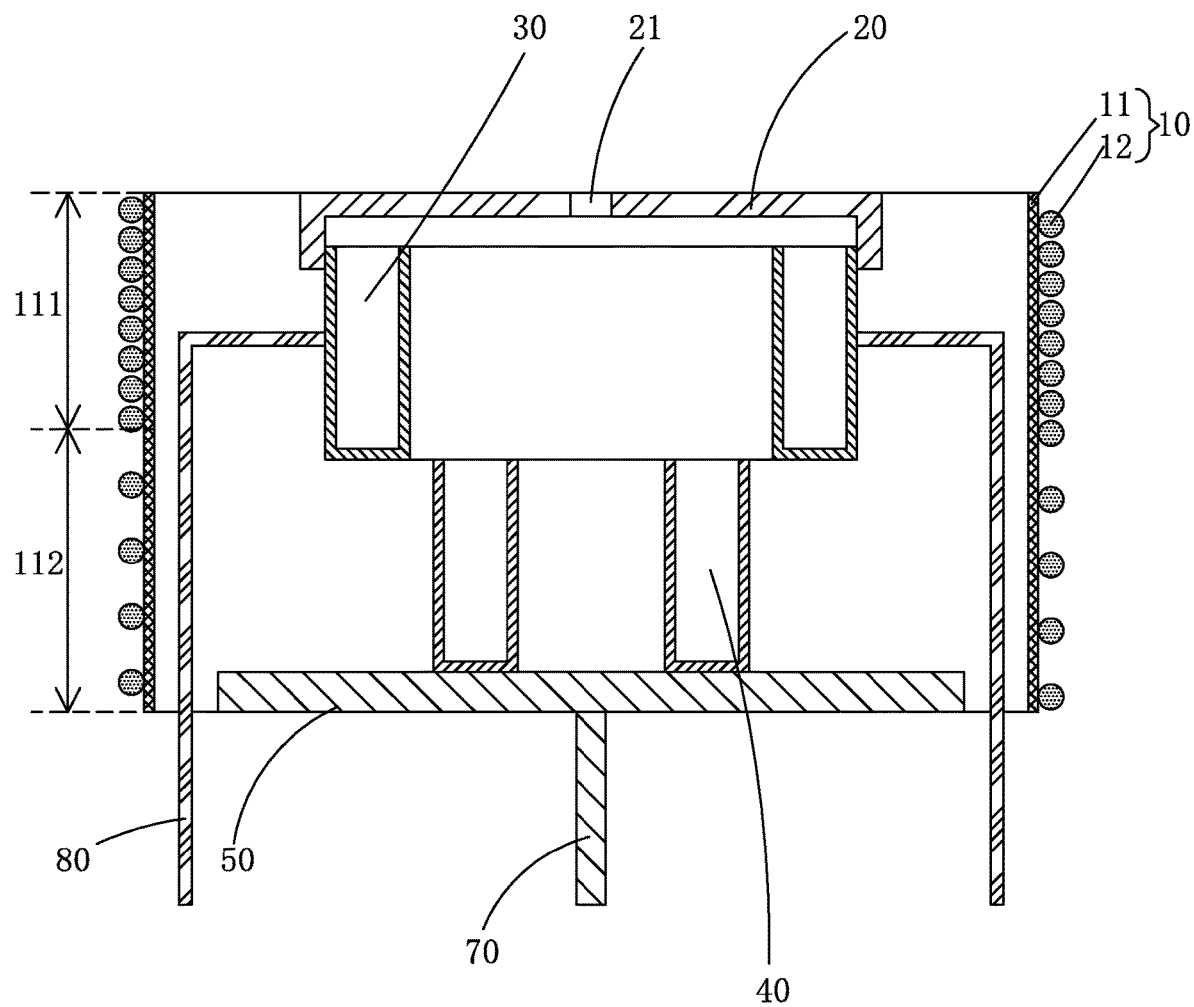
FIG. 3 is a cross-sectional view showing a first embodiment of the vapor deposition apparatus of the present invention on a vertical plane.
Figure 4:
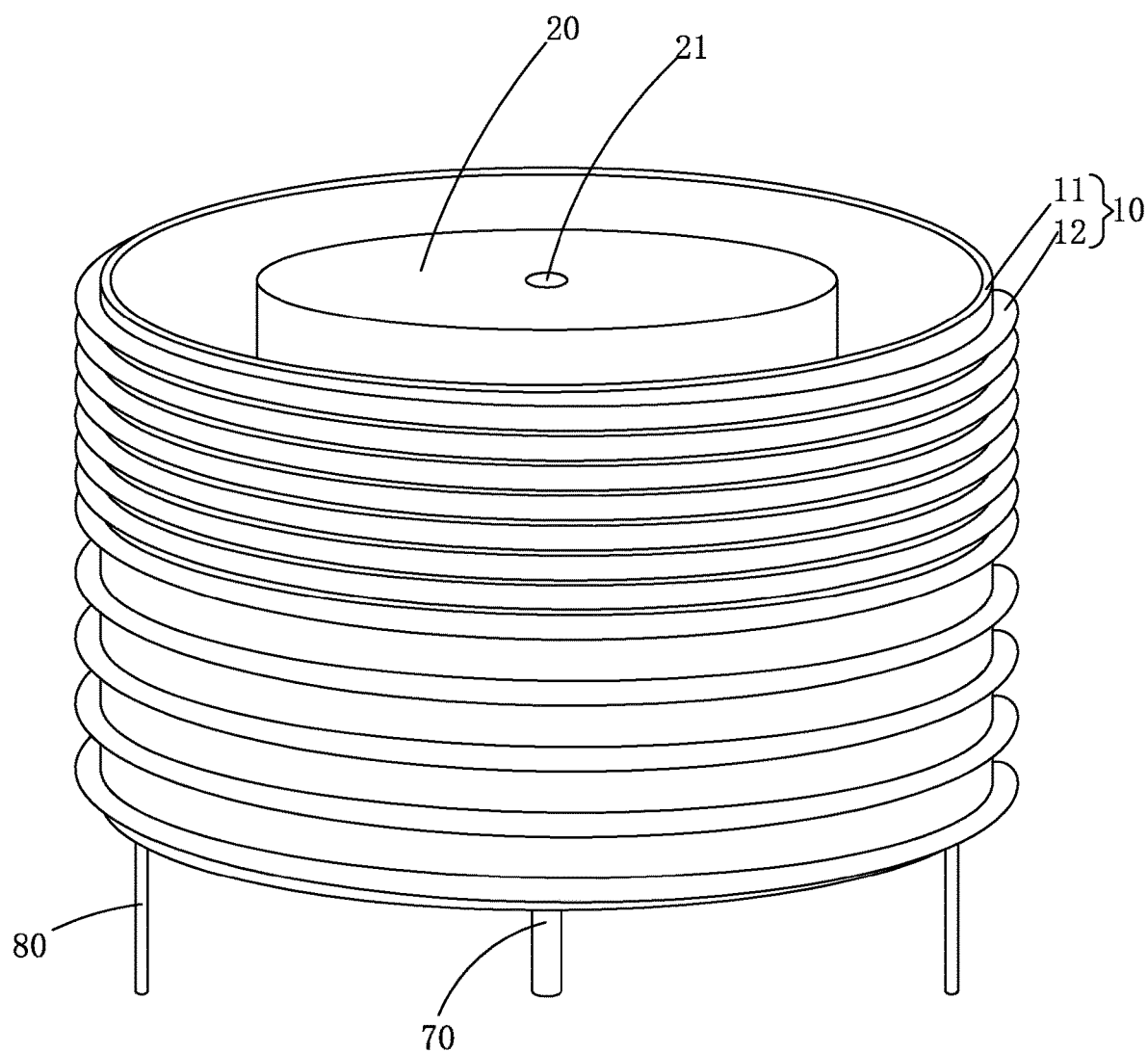
FIG. 4 is a schematic view showing the first embodiment of the vapor deposition apparatus of the present invention.
Figure 5:
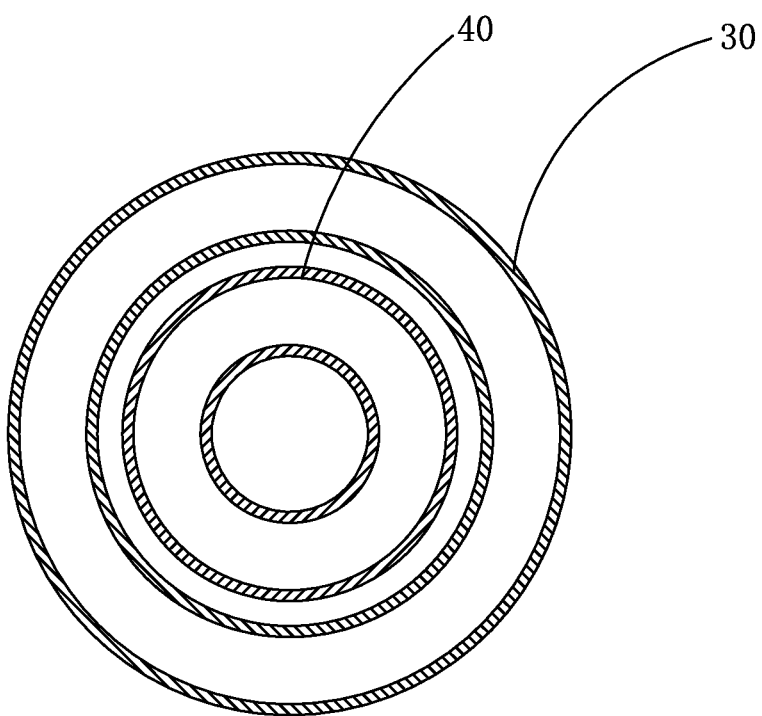
FIG. 5 is a cross-sectional view showing the first crucible and the second crucible of the first embodiment of the vapor deposition apparatus of the present invention on a horizontal plane.

Specifically, refer to FIG. 3 and FIG. 5. In the first embodiment of the vapor deposition apparatus of the present invention, a gap is kept between the inner sidewall of the first crucible 30 and the outer sidewall of the second crucible 40 to prevent the first crucible 30 and the second crucible 40 from incapability to move relatively to each other due to thermal expansion during vapor deposition.

Specifically, the crucible lid 20 and the outer sidewall of the first crucible 30 are coupled by screw thread.

Figure 6:
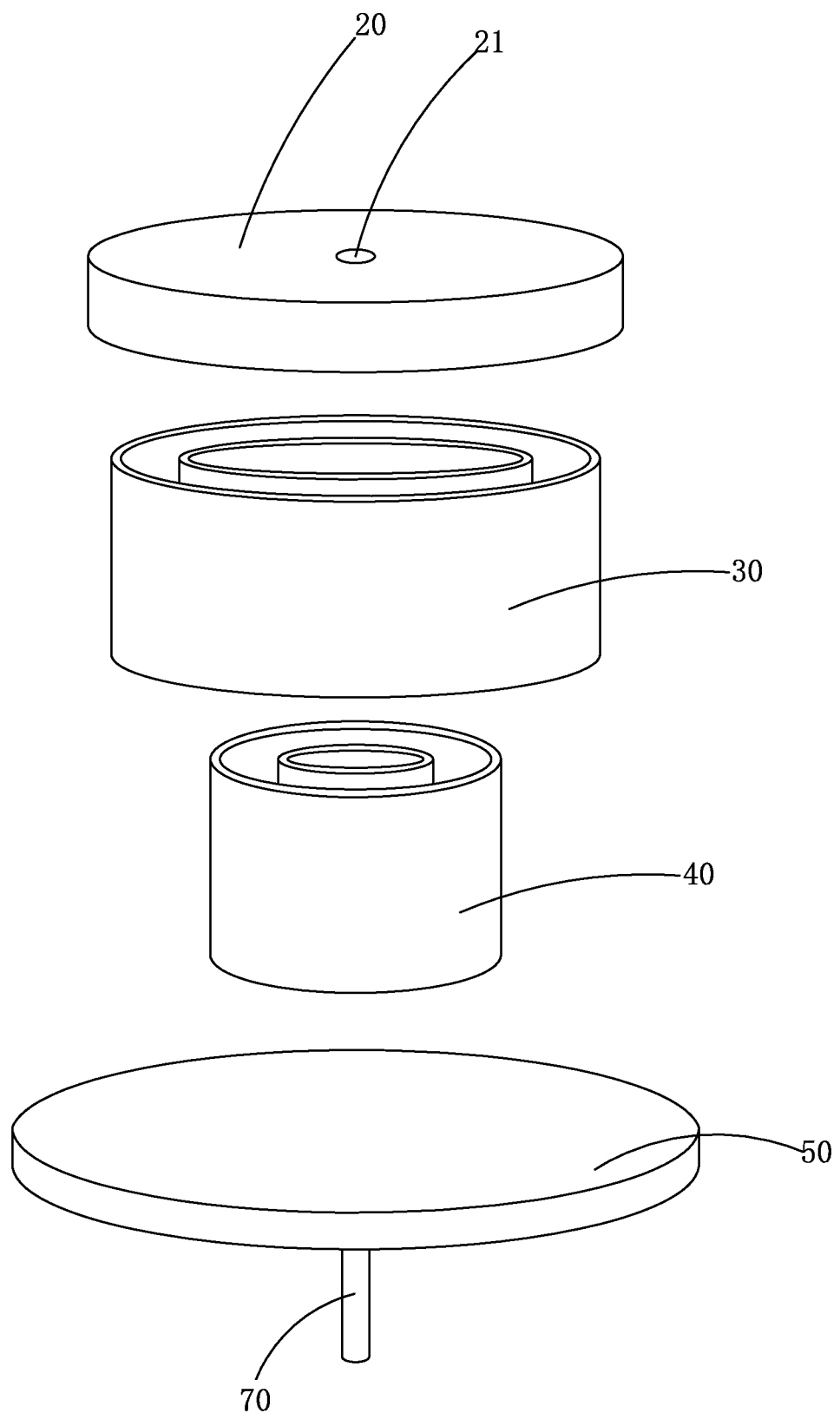
FIG. 6 is a schematic view showing the crucible lid, the first crucible, the second crucible and the moving part of the first embodiment of the vapor deposition apparatus of the present invention on a horizontal plane.

Specifically, refer to FIG. 3, FIG. 5 and FIG. 6. In the first embodiment of the vapor deposition apparatus of the present invention, the inner sidewalls and the outer sidewalls of the first crucible 30 and the second crucible 40 are both cylindrical; the axes of the inner sidewall and the outer sidewall of the second crucible 40 are coincident with the axes of the inner sidewall and the outer sidewall of the first crucible 30. The casing 11 is cylindrical and axis of the casing 11 coincides with the axis of the inner sidewall of the first crucible 30. The opening 21 is disposed correspondingly to the axis of the inner sidewall of the first crucible 30.

Specifically, the shape of the crucible lid 20 is round.

Specifically, the materials of the first crucible 30 and the second crucible 40 may be selected from materials commonly used in the prior art, for example, metals and alloys, such as, titanium and aluminum, or ceramics.

Specifically, refer to FIG. 3 and FIG. 6. In the first embodiment of the vapor deposition apparatus of the present invention, the moving part 50 is a piston, and a lower surface of the piston is provided with a rod 70.

Specifically, the materials of the piston and the rod 70 are selected to be a material resistant to high temperatures. For example, the material of the piston and the rod body 70 may be metal, rubber or the like.

Specifically, the height of the first crucible 30 in vertical direction is greater than or equal to the height of the second crucible 40 in vertical direction, so that the second crucible 40 can be completely placed into inside the inner sidewall of the first crucible 30.

Figure 14:
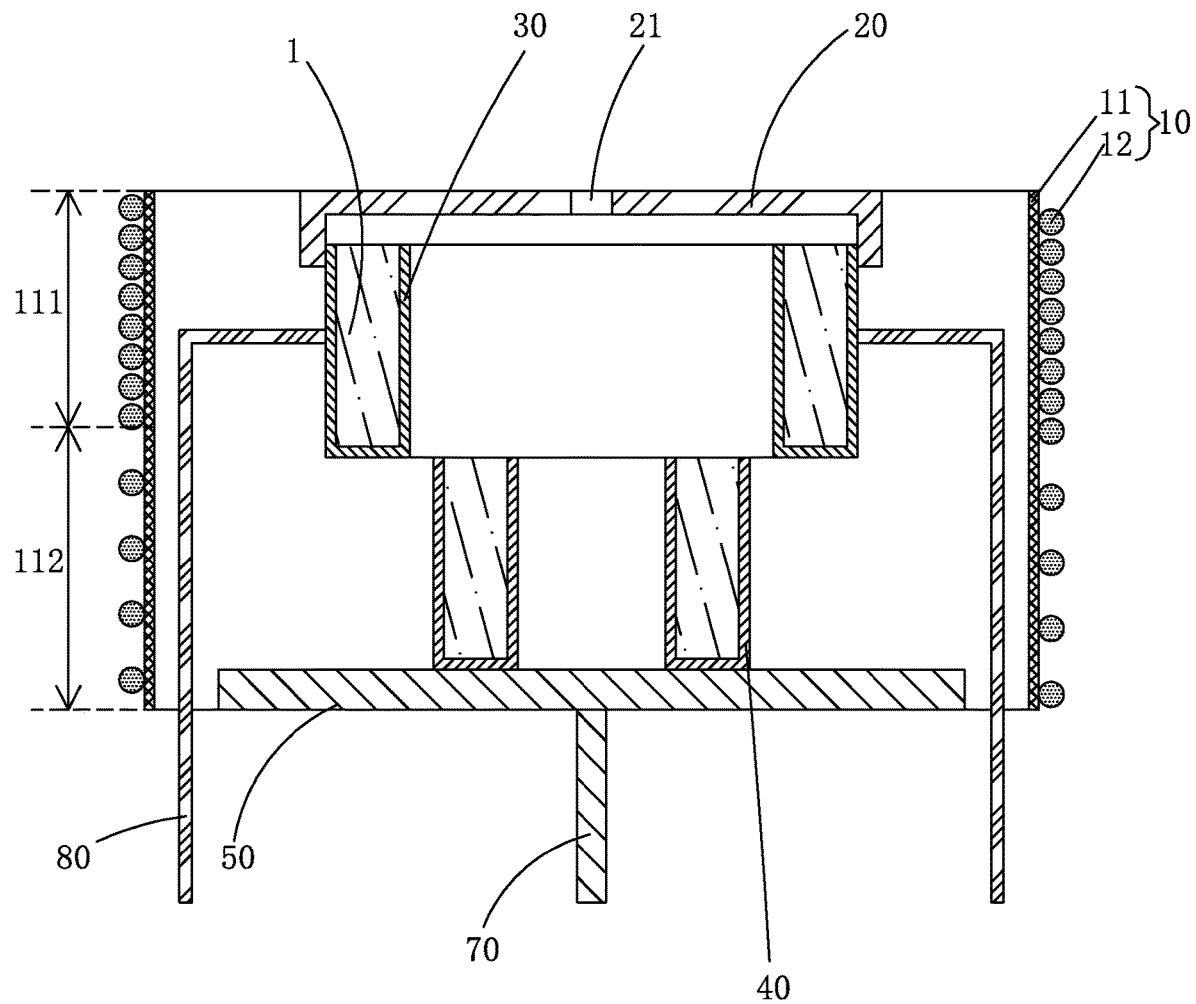
FIG. 14 is a schematic view showing Step S1 of the first embodiment of the vapor deposition method of the present invention.
Figure 15:
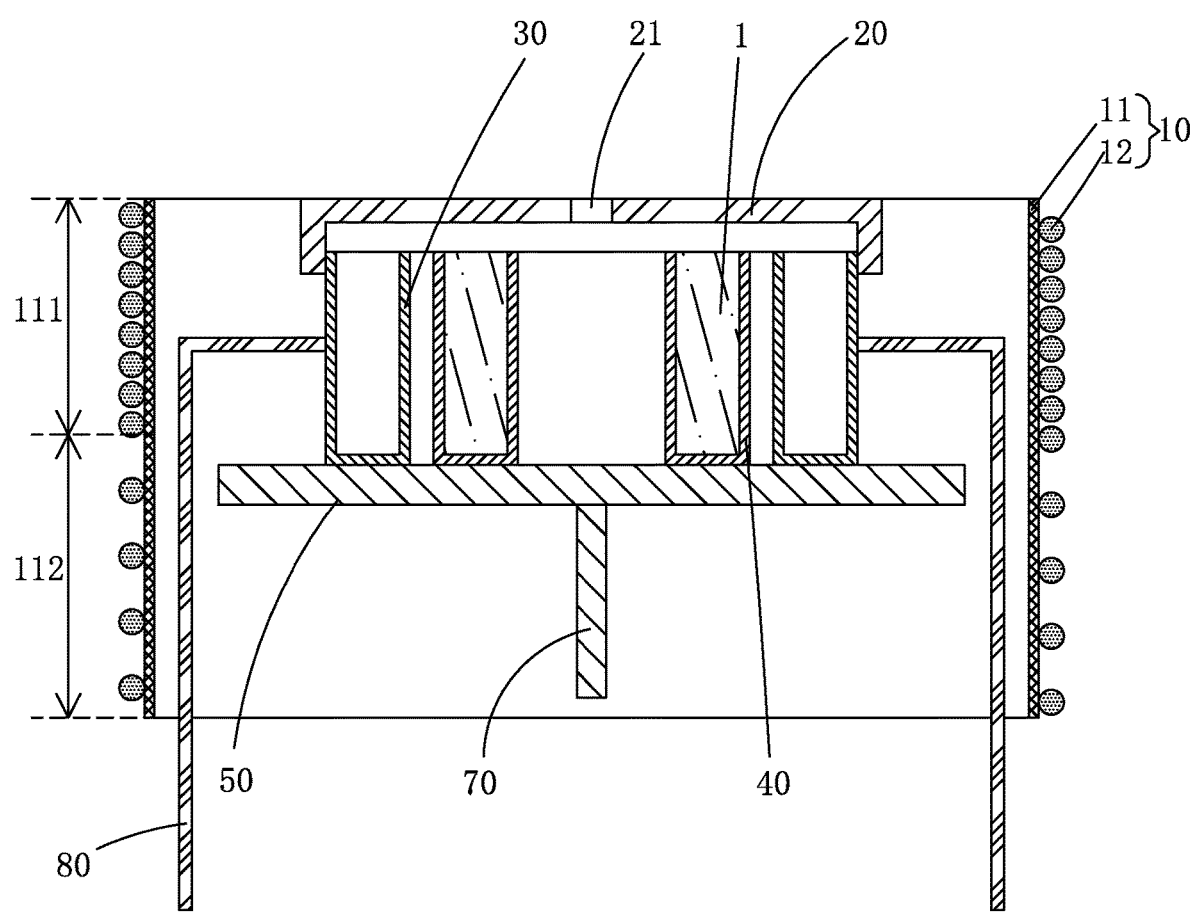
FIG. 15 is a schematic view showing Step S3 of the first embodiment of the vapor deposition method of the present invention.

Specifically, refer to FIG. 14 and FIG. 15. When using the first embodiment of the vapor deposition apparatus of the present invention to perform vapor deposition process, the first step is to place a vapor deposition material 1 in the first crucible 30 and the second crucible 40, and use the rod 70 to move the moving part 50 to position the second crucible 40 under the first crucible 30. Then, the next step is to energize the heating wire 12. Because the density of the heating wire 12 in the first region 111 is greater than the density of the heating wire 12 in the second region 112, the heating wire 12 in the first region 111 generates more heat than in the second region 112 after the same electric current is supplied. Therefore, by controlling the electricity entering the heating wire 12, the heat generated by the heating wire 12 in the first region 111 can evaporate the vapor deposition material 1 in the first crucible 30 to discharge through the opening 21. At the same time, the heat generated by the heating wire 12 in the second region 112 can preheat the vapor deposition material 1 in the second crucible 40 to a default temperature below evaporation. Also, as the first crucible 30 is hollow, the temperature difference in the radial direction is smaller than that of the conventional crucible, so that the vapor deposition material 1 in the first crucible 30 is uniformly heated, and the vapor deposition effect is good. Subsequently, after the vapor deposition material 1 in the first crucible 30 is completely evaporated, the heating wire 12 is kept energized. The moving part 50 is moved upward to raise the second crucible 40 to position the second crucible 40 located in the inner side of the first crucible 30, and the heating wire 12 heats the vapor deposition material 1 in the second crucible 40 to evaporation temperature to evaporate and discharge through the opening 21. The material in the second crucible 40 does not degrade, so the utilization of the vapor deposition material is improved. Since the second crucible 40 also adopts a hollow design, the radial temperature difference is smaller than that of the conventional crucible, so the vapor deposition material 1 in the second crucible 40 is uniformly heated, and the effect of vapor deposition is good.

Figure 7:
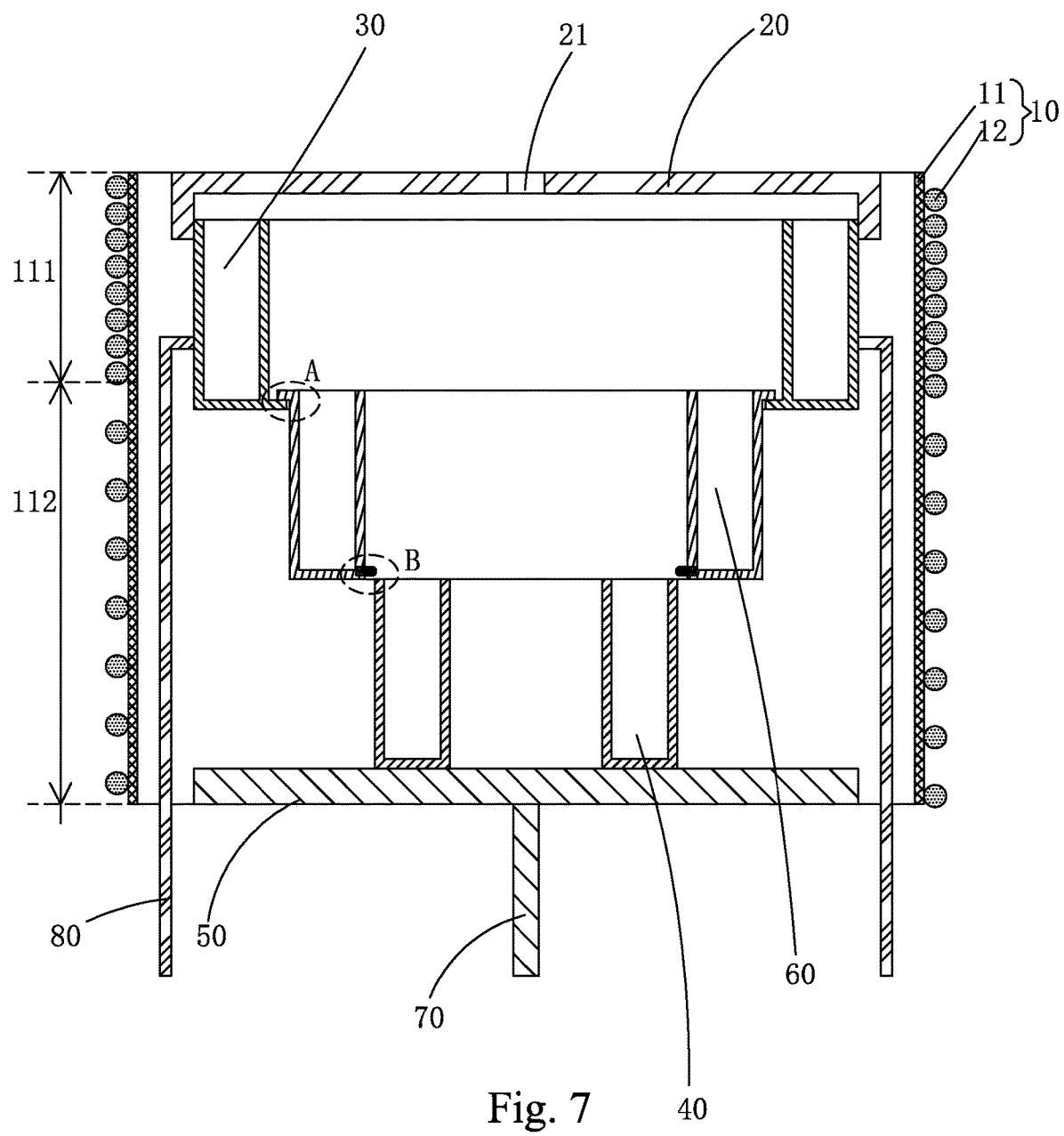
FIG. 7 is a cross-sectional view showing a second embodiment of the vapor deposition apparatus of the present invention on a vertical plane.
Figure 8:
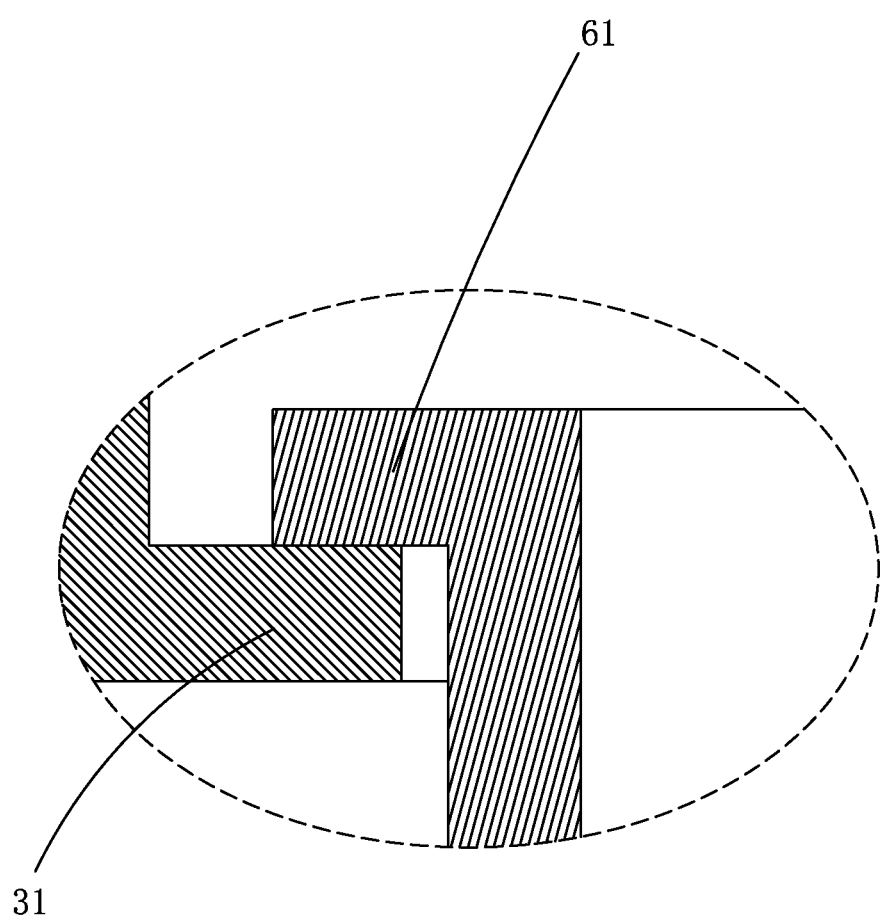
FIG. 8 is an enlarged view showing A in FIG. 7.
Figure 9:
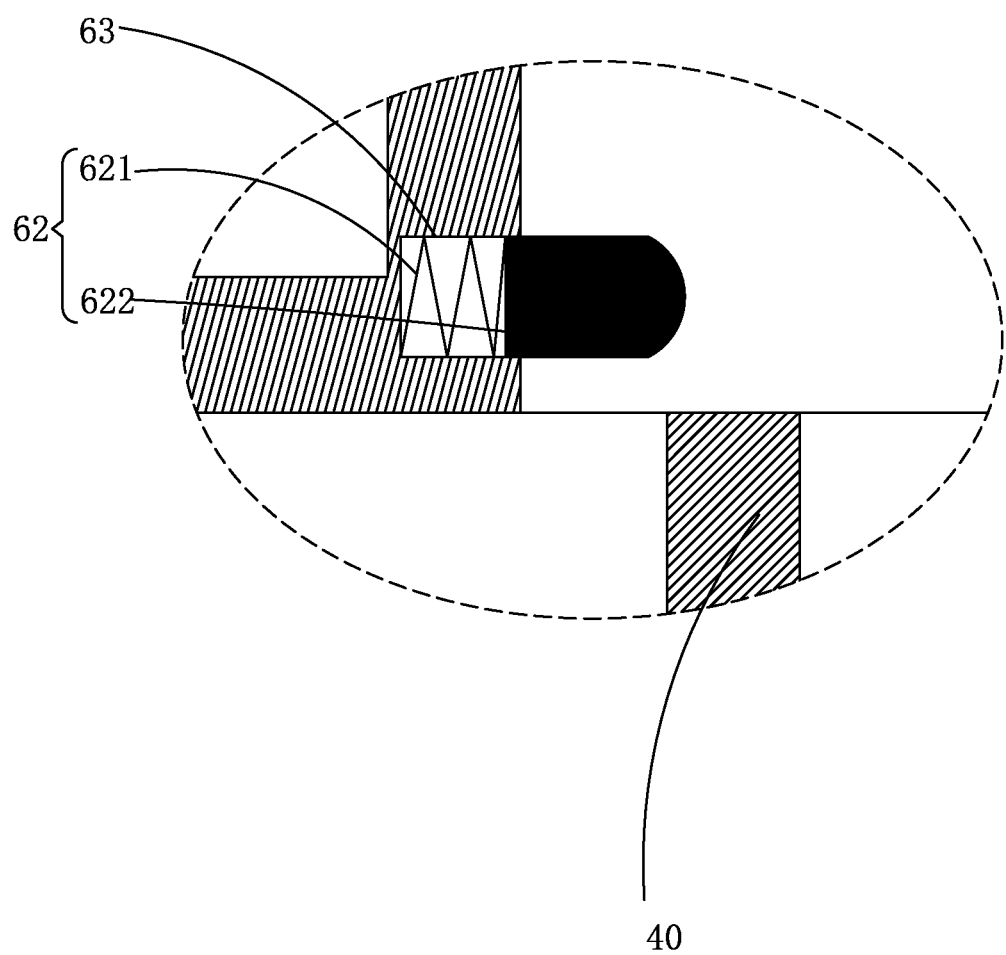
FIG. 9 is an enlarged view showing B in FIG. 7.
Figure 10:
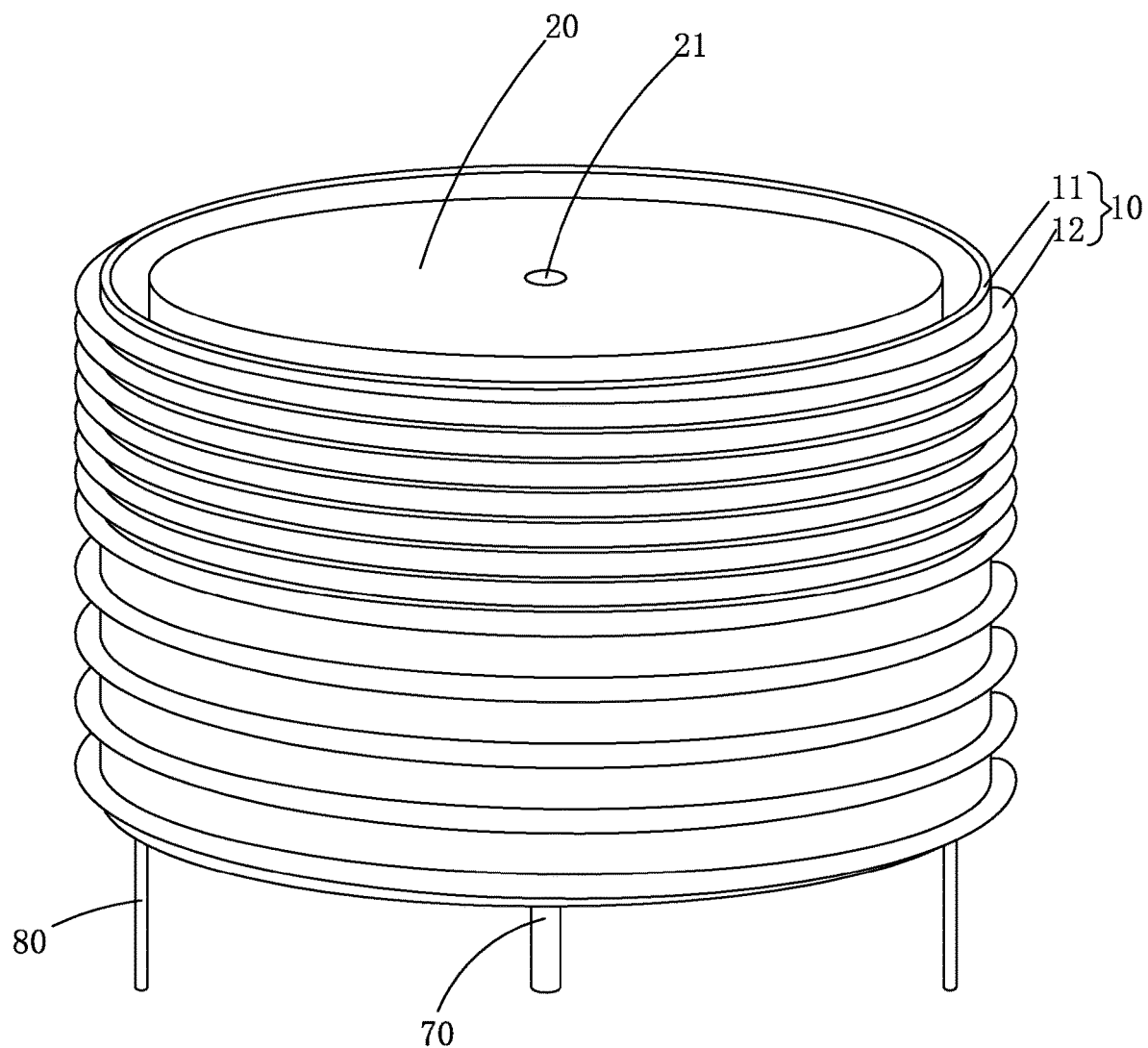
FIG. 10 a schematic view showing the second embodiment of the vapor deposition apparatus of the present invention.

Refer to FIGS. 7-12 for the second embodiment of the vapor deposition apparatus of the present invention. The second embodiment differs from the first embodiment in that the vapor deposition apparatus of the second embodiment further comprises a third crucible 60 housed in the heating source 10. The third crucible 60 is disposed under the crucible lid 20. The third crucible 60 comprises an inner sidewall, an outer sidewall disposed outside the inner sidewall, and a bottom connecting the inner sidewall and the outer sidewall and located at an end away from the crucible lid 20. The projection of the inner sidewall of the first crucible 30 in vertical direction is located outside the outer sidewall of the third crucible 60; projection of the inner sidewall of the third crucible 60 in vertical direction is located outside the outer sidewall of the second crucible 40. Refer to FIG. 7 and FIG. 8. A first limiting portion 31 is disposed at bottom portion of inner surface of the inner sidewall of the first crucible 30, and a second limiting portion 61 is disposed at top portion of outer surface of the outer sidewall of the third crucible 60. Projections of the first limiting portion 31 and the second limiting portion 61 in vertical direction at least partially overlap, and the first limiting portion 31 is located below the second limiting portion 61 to perform restriction on the second limiting portion 61. Refer to FIG. 7 and FIG. 9. The bottom portion of the inner surface of the inner sidewall of the third crucible 60 is provided with an elastic limiting unit 62, and projection of the elastic limiting unit 62 in vertical direction at least partially overlaps with projection of the outer sidewall of the second crucible 40 in vertical direction. When a gap exists between an end of the third crucible 60 near the crucible lid 20 and the crucible lid 20 and the outer sidewall of the second crucible 40 is located in below the elastic limiting unit 62, the moving part 50 is moved upward, and the outer sidewall of the second crucible 40 pushes the elastic limiting unit 62 of the third crucible 60 to raise the third crucible 60. When the end of the third crucible 60 near the crucible lid 20 contacts the crucible lid 20 and the outer sidewall of the second crucible 40 is located below the elastic limiting unit 62, the moving part 50 is moved upward, and the outer sidewall of the second crucible 40 compresses the elastic limiting unit 62 to move into inside of the inner sidewall of the third crucible 60.

Figure 11:
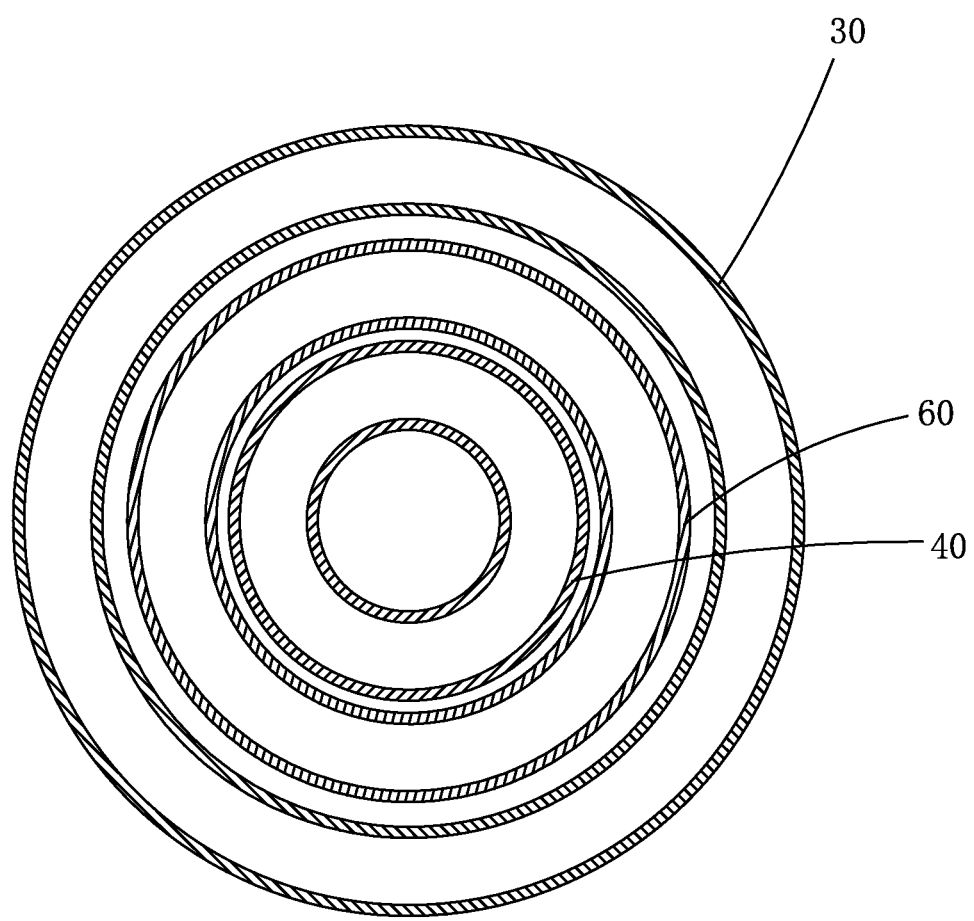
FIG. 11 is a cross-sectional view showing the first crucible and the second crucible of the second embodiment of the vapor deposition apparatus of the present invention on a horizontal plane.
Figure 12:
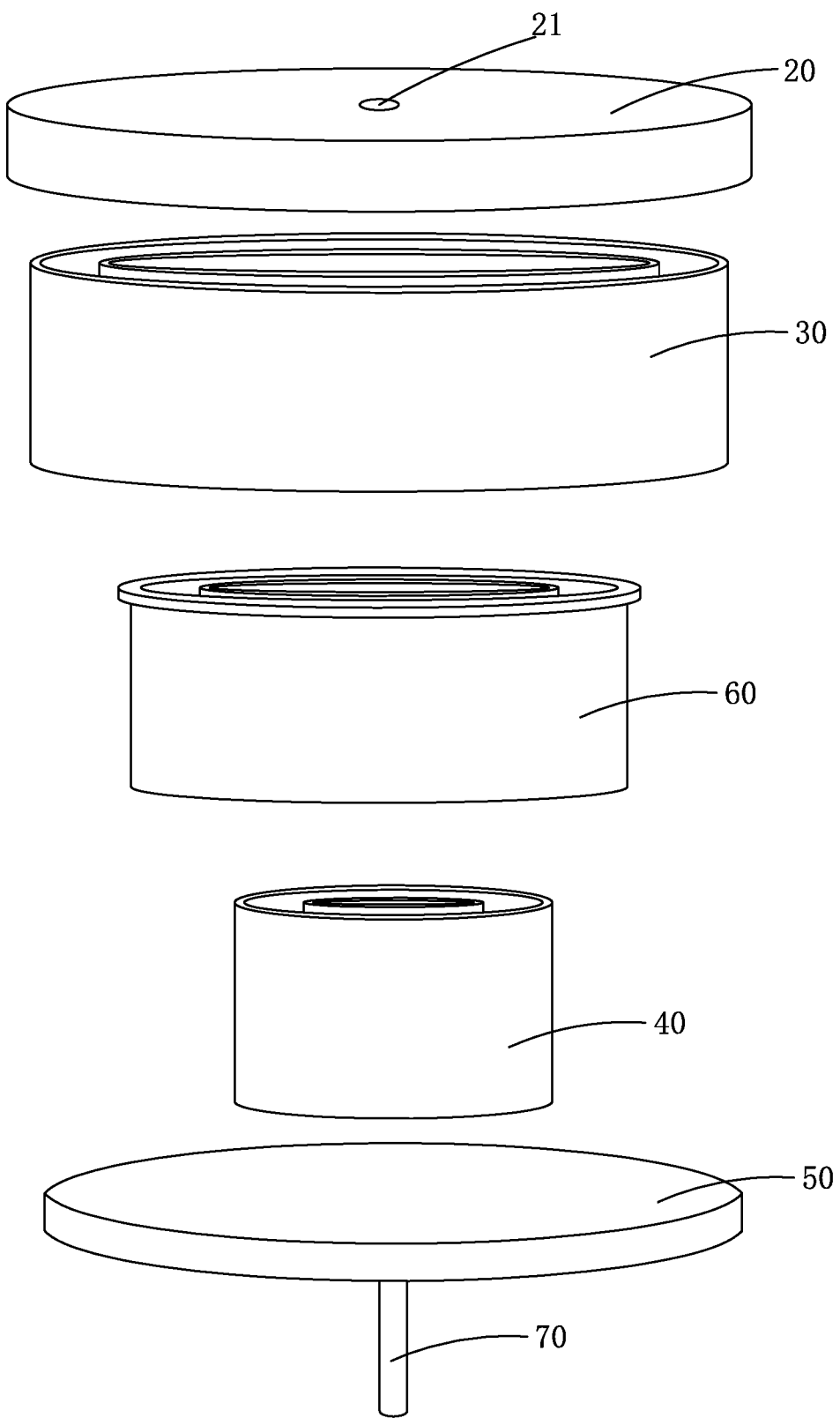
FIG. 12 is a schematic view showing the crucible lid, the first crucible, the second crucible and the moving part of the second embodiment of the vapor deposition apparatus of the present invention on a horizontal plane.

Specifically, refer to FIG. 7, FIG. 11 and FIG. 12. The inner sidewalls and the outer sidewalls of the third crucible 60 are cylindrical; the axes of the inner sidewall of the outer sidewall of the second crucible 40, the axes of the inner sidewall and the outer sidewall of the first crucible 30 are coincident with the axes of the inner sidewall and the outer sidewall of the third crucible 60.

Specifically, refer to FIG. 7 and FIG. 9. A groove 63 is disposed corresponding to the elastic limiting unit 62 at the bottom surface of the inner surface of the inner sidewall of the third crucible 60. The elastic limiting unit 62 comprises a spring 621 disposed in the corresponding groove 63 and a protruding portion 622 contacting an end of the spring 621 away from bottom of the groove 63 and exposed outside the groove 63. An end of the protruding portion 622 away from the bottom of the groove 63 is a circular arc surface. Projection of the protruding portion 622 in vertical direction at least partially overlaps with the projection of the outer sidewall of the second crucible 40 in vertical direction. When a gap existing between an end of the third crucible 60 near the crucible lid 20 and the crucible lid 20 and the outer sidewall of the second crucible 40 is located in below the elastic limiting unit 62, the moving part 50 is moved upward, the outer sidewall of the second crucible 40 pushes the circular arc surface at the end of the protruding portion 622 away from the bottom of the groove 63 to raise the third crucible 60. When the end of the third crucible 60 near the crucible lid contacts the crucible lid 20 and the outer sidewall of the second crucible 40 is located below the elastic limiting unit 62, the moving part 50 is moved upward, and the outer sidewall of the second crucible 40 pushes the circular arc surface at the end of the protruding portion 622 away from the bottom of the groove 63 to compresses the spring 61 to move the protruding portion 622 towards the bottom of the groove 63 so that the second crucible 40 moves to inside the inner sidewall of the third crucible 60.

Preferably, the height of the first crucible 30 in vertical direction is greater than or equal to the height of the third crucible 60 in vertical direction, so that the third crucible 60 can be completely inserted inside the inner sidewall of the first crucible 30.

Preferably, refer to FIG. 7 and FIG. 11. In the second embodiment of the vapor deposition apparatus of the present invention, a gap is left between the inner sidewall of the first crucible 30 and the outer sidewall of the third crucible 60, and a gap is left between the inner sidewall of the third crucible 60 and the outer sidewalls of the second crucible 40 to prevent the first crucible 30, the second crucible 40, and the third crucible 60 from being thermally expanded and unable to move relative to each other during vapor deposition process.

Specifically, the material of the third crucible 60 may be selected from materials commonly used in the prior art, for example, metals and alloys such as titanium and aluminum, or ceramics.

The remaining is the same as the first embodiment of the vapor deposition apparatus described above and will not be described herein again.

Specifically, When using the second embodiment of the vapor deposition apparatus of the present invention to perform vapor deposition process, the first step is to place a vapor deposition material 1 in the first crucible 30, the second crucible 40 and the third crucible 60, and use the rod 70 to move the moving part 50 to position the second crucible 40 under the third crucible 60 and the third crucible 60 is lowered by gravity until the second limiting portion 61 comes into contact with the first limiting portion 31 of the first crucible 30. Then, the next step is to energize the heating wire 12. Because the density of the heating wire 12 in the first region 111 is greater than the density of the heating wire 12 in the second region 112, the heating wire 12 in the first region 111 generates more heat than in the second region 112 after the same electric current is supplied. Therefore, by controlling the electricity entering the heating wire 12, the heat generated by the heating wire 12 in the first region 111 can evaporate the vapor deposition material 1 in the first crucible 30 to discharge through the opening 21. At the same time, the heat generated by the heating wire 12 in the second region 112 can preheat the vapor deposition material 1 in the second crucible 40 and the third crucible 60 to a default temperature below evaporation. Also, as the first crucible 30 is hollow, the temperature difference in the radial direction is smaller than that of the conventional crucible, so that the vapor deposition material 1 in the first crucible 30 is uniformly heated, and the vapor deposition effect is good. Subsequently, after the vapor deposition material 1 in the first crucible 30 is completely evaporated, the heating wire 12 is kept energized. The moving part 50 is moved upward to raise the second crucible 40. In the process, refer to FIG. 17. The outer sidewall of the second crucible 40 first pushes the elastic limiting unit 62 of the third crucible 60 to raise the third crucible 60. Specifically, the outer sidewall of the second crucible 40 pushes the protruding portion 622 of the limiting unit 62 is pushed the circular arc surface at the end of the protruding portion 622 away from the bottom of the groove 63. Since the third crucible 60 is not in contact with the crucible lid 20 at this time, the third crucible 60 is not affected by the downward force provided by the crucible lid 20. Therefore, the outer sidewall of the second crucible 40 pushes t the circular arc surface at the end of the protruding portion 622 away from the bottom of the groove 63 to raise the third crucible 60. After the third crucible 60 is located inside the first crucible 30 and a gap exists between the end of the inner sidewall of the third crucible 60 near the crucible lid 20 and the crucible 20 in vertical direction, the heating wire 12 heats the vapor deposition material 1 in the third crucible 60 to the evaporation temperature. The vapor deposition material 1 in the third crucible 60 is evaporated and discharged through the opening 21 and the material in the third crucible 60 is not degraded, thereby improving the utilization of the evaporation material. Since the third crucible 60 also adopts a hollow design, the radial temperature difference is smaller than that of the conventional crucible, so the vapor deposition material 1 in the third crucible 60 is uniformly heated, and the effect of vapor deposition is good. Then, refer to FIG. 18. After the vapor deposition material 1 in the third crucible 60 is evaporated, the moving part 50 is moved again. Under the pushing of the moving part 50, the outer sidewall of the second crucible 40 continues to push the elastic limiting unit 62 of the third crucible 60 to raise the third crucible 60 to contact with the crucible lid 20. At this point, the crucible lid 20 will provide a downward force to the third crucible 60. Then, the moving part 50 is further raised and the outer sidewall of the second crucible 40 compresses the elastic limiting unit 62. Refer to FIG. 19. Specifically, the outer sidewall of the second crucible 40 pushes the circular arc surface at the end of the protruding portion 622 of the elastic limiting unit 62 away from the bottom of the groove 63 to compress the spring 621, and the protruding portion 622 moves toward the bottom of the groove 63, so that the second crucible 40 can move to inside of the inner sidewall of the first crucible 30. The heating wire 12 can heat the vapor deposition material 1 in the second crucible 40 to the evaporation temperature, and the vapor deposition material 1 in the second crucible 40 is evaporated and discharged through the opening 21. The material in the second crucible 40 does not degrade, so the utilization of the vapor deposition material is improved. Since the second crucible 40 also adopts a hollow design, the radial temperature difference is smaller than that of the conventional crucible, so the vapor deposition material 1 in the second crucible 40 is uniformly heated, and the effect of vapor deposition is good.

Based on the same principle, referring to FIG. 14 and FIG. 15, the present invention also provides a first embodiment of the vapor deposition method, applicable to the first embodiment of the vapor deposition apparatus, comprising the following steps:

Step S1: referring to FIG. 14, placing a vapor deposition material 1 in the first crucible 30 and the second crucible 40, and using the rod 70 to move the moving part 50 to position the second crucible 40 under the first crucible 30.

Step S2: energizing the heating wire 12, the heating wire 12 heating the vapor deposition material 1 in the first crucible 30 to evaporate and discharging through the opening 21, and the heating wire 12 preheating the vapor deposition material 1 in the second crucible 40.

Specifically, because the density of the heating wire 12 in the first region 111 is greater than the density of the heating wire 12 in the second region 112, the heating wire 12 in the first region 111 generates more heat than in the second region 112 after the same electric current is supplied. Therefore, in Step S2, by controlling the electricity entering the heating wire 12, the heat generated by the heating wire 12 in the first region 111 can evaporate the vapor deposition material 1 in the first crucible 30 to discharge through the opening 21. At the same time, the heat generated by the heating wire 12 in the second region 112 can preheat the vapor deposition material 1 in the second crucible 40 to a default temperature below evaporation. Also, as the first crucible 30 is hollow, the temperature difference in the radial direction is smaller than that of the conventional crucible, so that the vapor deposition material 1 in the first crucible 30 is uniformly heated, and the vapor deposition effect is good.

Step S3: referring to FIG. 15, after all the vapor deposition materials 1 in the first crucible 30 evaporated, continuing energizing the heating wire 12, and the moving the moving part 50 upward to position the second crucible 40 located in the inner side of the first crucible 30, and the heating wire 12 heating the vapor deposition material 1 in the second crucible 40 to evaporate and discharge through the opening 21.

Specifically, in Step S3, the heating wire 12 heats the vapor deposition material 1 in the second crucible 40 from default temperature to evaporation temperature. The material in the second crucible 40 does not degrade, so the utilization of the vapor deposition material is improved. Since the second crucible 40 also adopts a hollow design, the radial temperature difference is smaller than that of the conventional crucible, so the vapor deposition material 1 in the second crucible 40 is uniformly heated, and the effect of vapor deposition is good.

Figure 13:
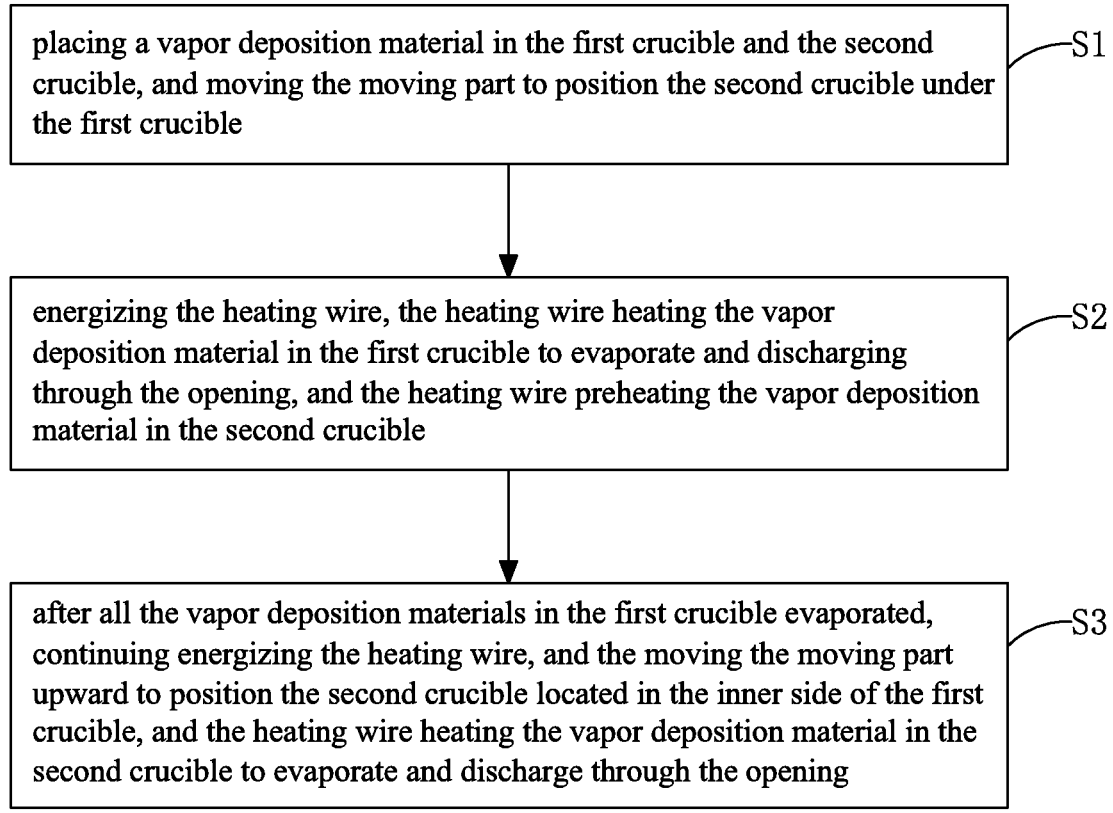
FIG. 13 is a schematic view showing the flowchart of the vapor deposition method of the present invention.
Figure 16:
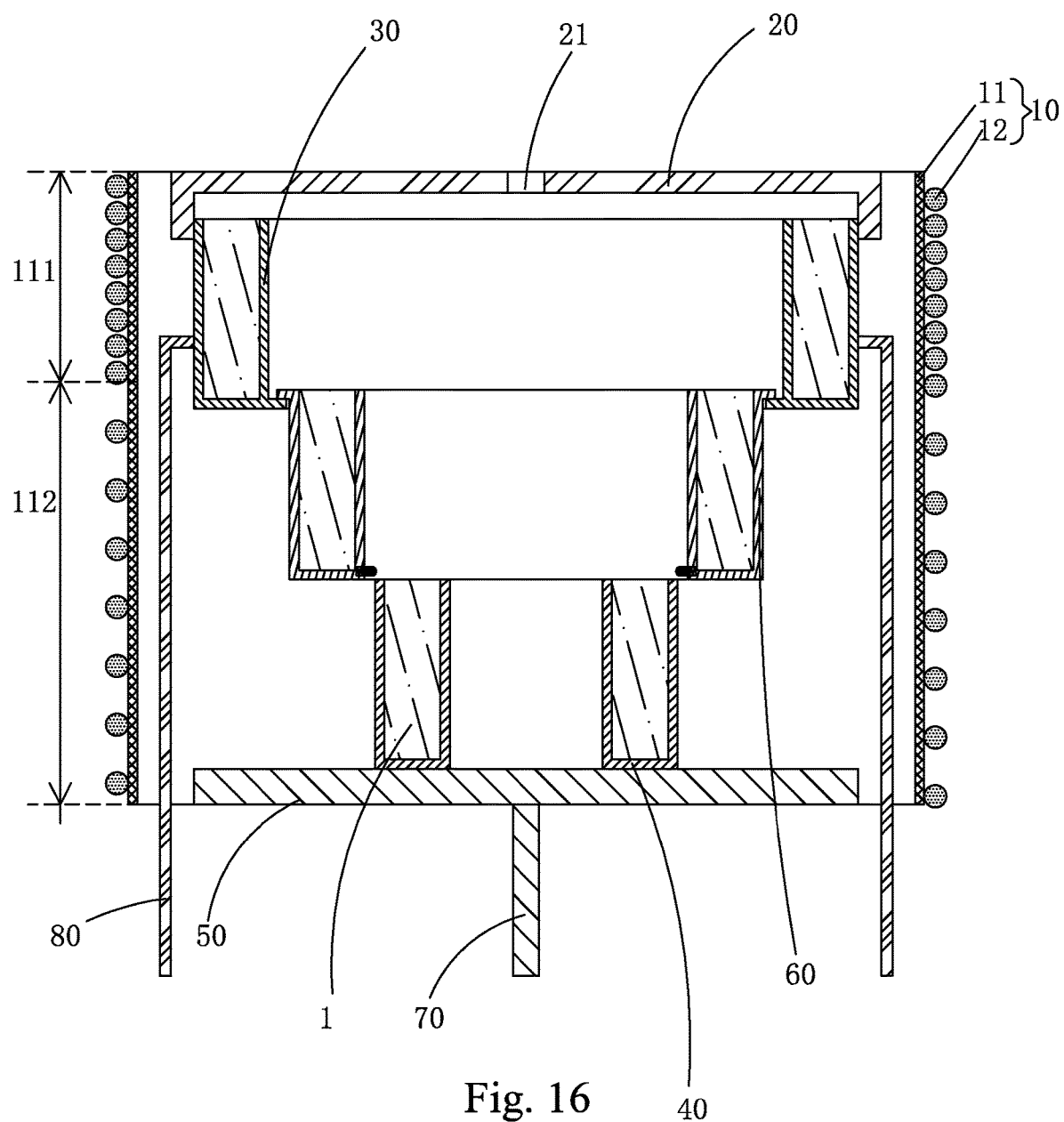
FIG. 16 is a schematic view showing Step S1 of the second embodiment of the vapor deposition method of the present invention.
Figure 17:
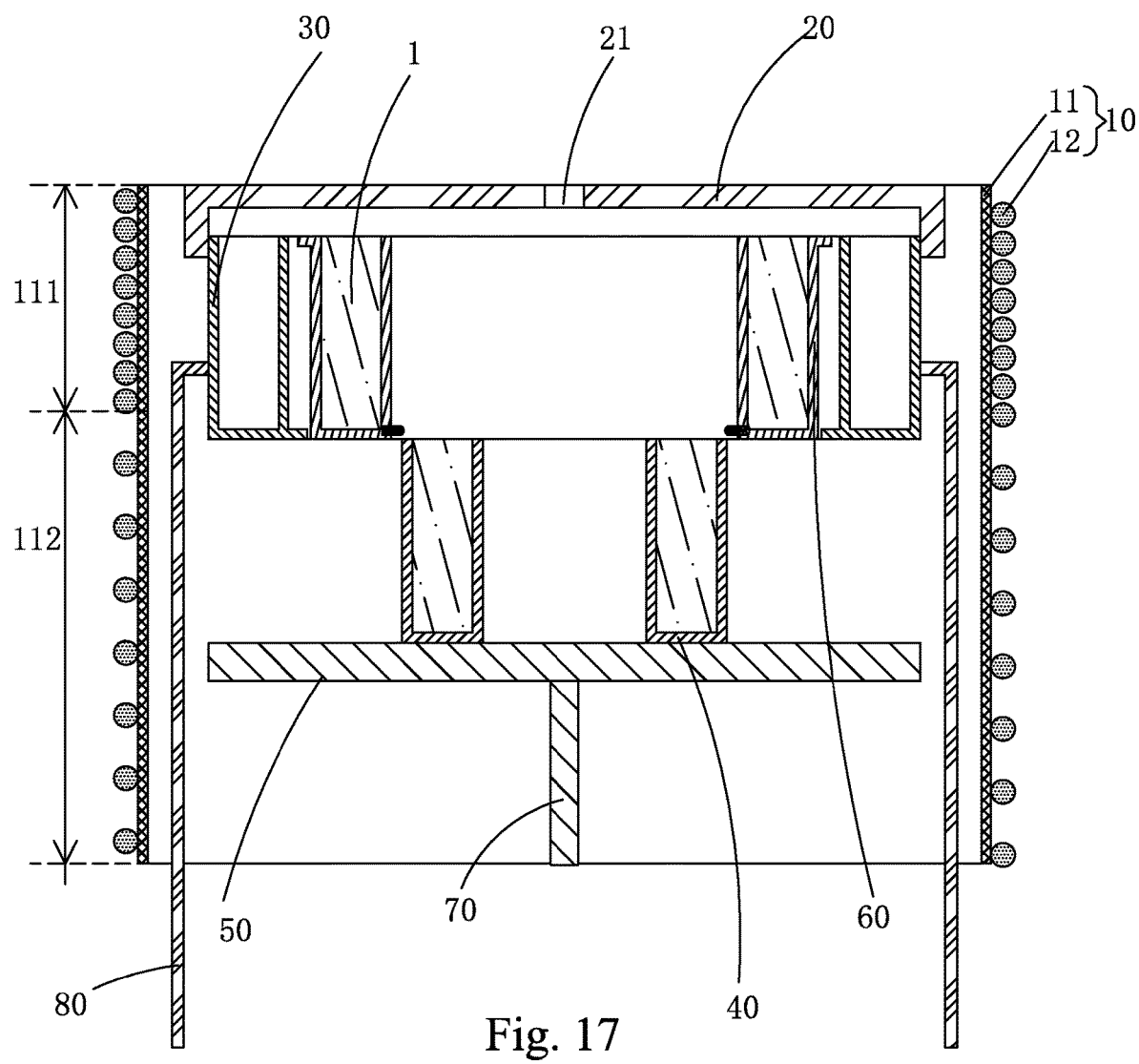
FIGS. 17 and 18 are schematic views showing Step S3 of the second embodiment of the vapor deposition method of the present invention.
Figure 18:
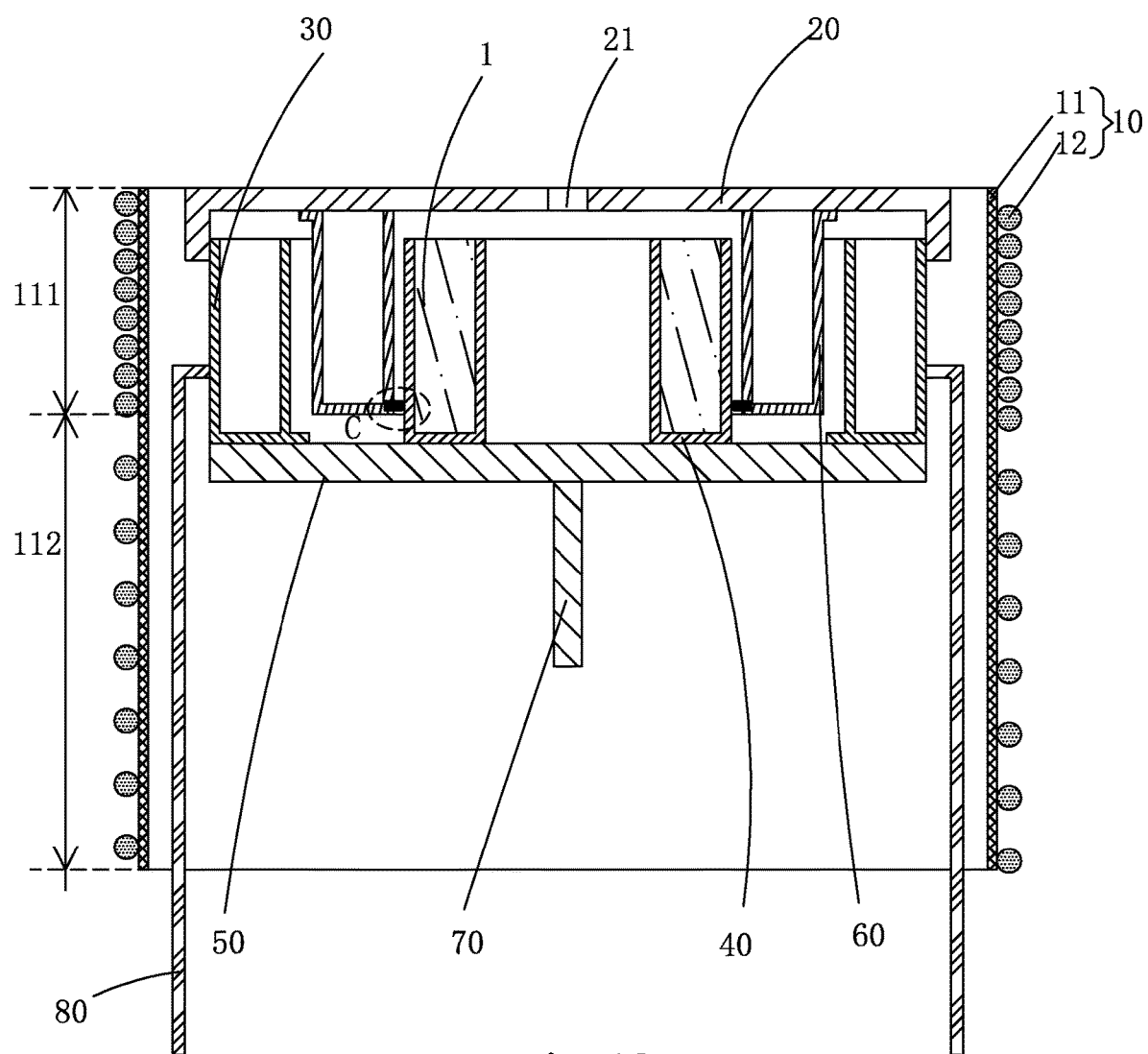
Figure 19:
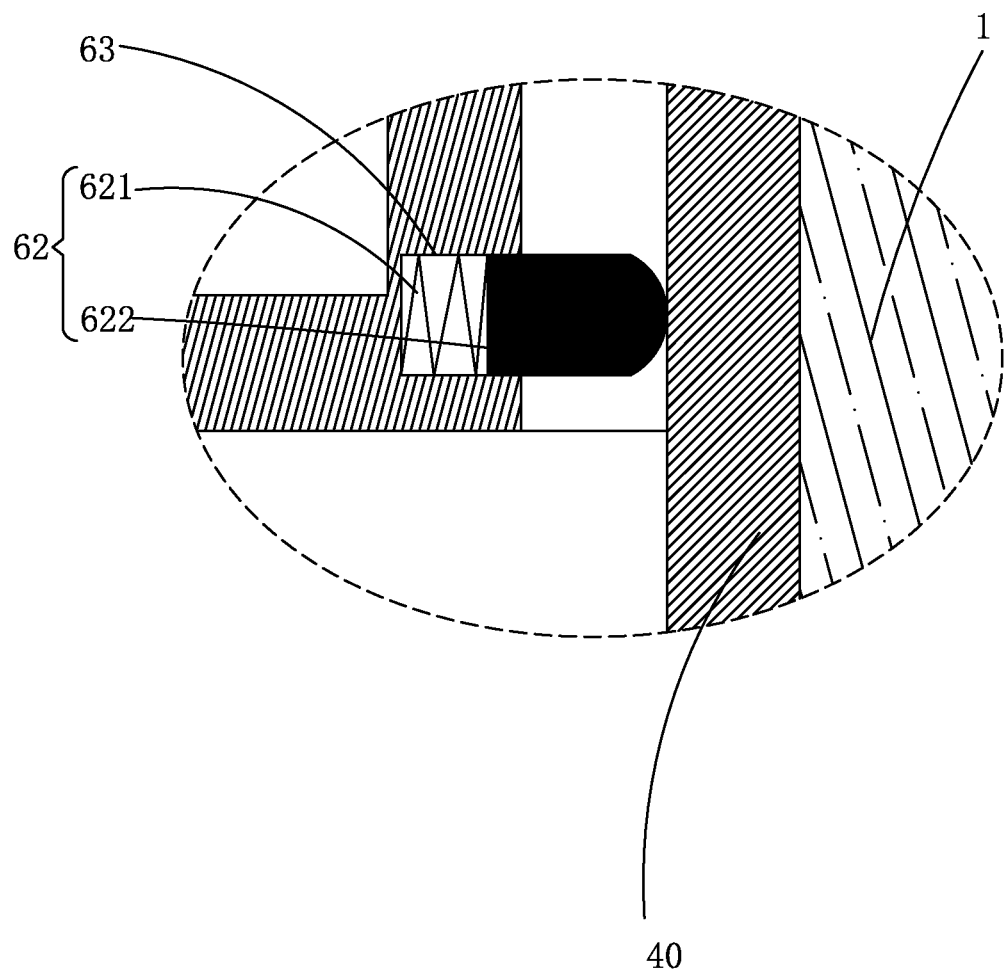
FIG. 19 is an enlarged view showing C in FIG. 18.

Refer to FIG. 13, as well as FIGS. 16-19. The second embodiment of the vapor deposition method of the present invention, when applied to the second embodiment of the vapor deposition apparatus, differs from the first embodiment of the vapor deposition method in that, as shown in FIG. 16, in Step S1, when placing the vapor deposition material 1 in the first crucible 30 and the second crucible 40, the vapor deposition material 1 is also placed in the third crucible 60, and when using the rod 70 to move the moving part 50 to position the second crucible 40 under the third crucible 60, the second crucible 40 is under the third crucible 60 and the third crucible 60 is also lowered by gravity until the second limiting portion 61 comes into contact with the first limiting portion 31 of the first crucible 30. In Step S2, when the heating wire 12 is preheating the vapor deposition material 1 in the second crucible 40 to a default temperature below evaporation, the heating wire 12 is also preheating the vapor deposition material 1 in the third crucible 60 to a default temperature below evaporation. Refer to FIG. 17 and FIG. 18. In Step S3, the process of moving the moving part 50 upward to position the second crucible 40 in the inner side of the first crucible 30 is specifically divided into two steps:

first, referring to FIG. 17, the moving part 50 is moved upward, and the outer sidewall of the second crucible 40 first pushes the elastic limiting unit 62 of the third crucible 60 to raise the third crucible 60, specifically, the outer sidewall of the second crucible 40 pushes the protruding portion 622 of the limiting unit 62 is pushed the circular arc surface at the end of the protruding portion 622 away from the bottom of the groove 63. Since the third crucible 60 is not in contact with the crucible lid 20 at this time, the third crucible 60 is not subjected to the downward force provided by the crucible lid 20, and thus the pushing of the protruding portion 622 of the limiting unit 62 is pushed the circular arc surface at the end of the protruding portion 622 away from the bottom of the groove 63 by the outer sidewall of the second crucible 40 will raise the third crucible 60 to move upward. After the third crucible 60 is located inside the first crucible 30 and a gap exists between the end of the inner sidewall of the third crucible 60 near the crucible lid 20 and the crucible 20 in vertical direction, the heating wire 12 heats the vapor deposition material 1 in the third crucible 60 to the evaporation temperature. The vapor deposition material 1 in the third crucible 60 is evaporated and discharged through the opening 21 and the material in the third crucible 60 is not degraded, thereby improving the utilization of the evaporation material. Since the third crucible 60 also adopts a hollow design, the radial temperature difference is smaller than that of the conventional crucible, so the vapor deposition material 1 in the third crucible 60 is uniformly heated, and the effect of vapor deposition is good. Then, refer to FIG. 18. After the vapor deposition material 1 in the third crucible 60 is evaporated, the moving part 50 is moved again. Under the pushing of the moving part 50, the outer sidewall of the second crucible 40 continues to push the elastic limiting unit 62 of the third crucible 60 to raise the third crucible 60 to contact with the crucible lid 20. At this point, the crucible lid 20 will provide a downward force to the third crucible 60. Then, the moving part 50 is further raised and the outer sidewall of the second crucible 40 compresses the elastic limiting unit 62. Refer to FIG. 19. Specifically, the outer sidewall of the second crucible 40 pushes the circular arc surface at the end of the protruding portion 622 of the elastic limiting unit 62 away from the bottom of the groove 63 to compress the spring 621, and the protruding portion 622 moves toward the bottom of the groove 63, so that the second crucible 40 can move to inside of the inner sidewall of the first crucible 30. The heating wire 12 can heat the vapor deposition material 1 in the second crucible 40 to the evaporation temperature, and the vapor deposition material 1 in the second crucible 40 is evaporated and discharged through the opening 21. The material in the second crucible 40 does not degrade, so the utilization of the vapor deposition material is improved. Since the second crucible 40 also adopts a hollow design, the radial temperature difference is smaller than that of the conventional crucible, so the vapor deposition material 1 in the second crucible 40 is uniformly heated, and the effect of vapor deposition is good.

In summary, the present invention provides a vapor deposition apparatus comprising a heating source, a crucible lid, a first crucible, a second crucible, a moving part, and a bracket. The first crucible, the second crucible and the moving part are respectively disposed under the crucible lid; the first crucible is fixed on the bracket; and the first crucible and the second crucible each comprises an inner sidewall, an outer sidewall disposed on outside of the inner sidewall, and a bottom connecting the inner sidewall and the outer sidewall and located at an end away from the crucible lid. The crucible lid is mounted on the outer sidewall of the first crucible, the second crucible is fixed to top surface of the moving part; projection of the inner sidewall of the first crucible in vertical direction is located outside the outer sidewall of the second crucible. The density of the heating wire of the heating source in the first region corresponding to the position of the crucible lid and the first crucible is greater than the density of the second region below the first region. The vapor deposition apparatus can effectively improve the utilization rate of the vapor deposition material, and can effectively reduce the radial temperature difference in the vapor deposition apparatus and improve the heat uniformity of the vapor deposition material in the vapor deposition apparatus. The vapor deposition method provided by the invention can effectively improve the utilization rate of the vapor deposition material, and can effectively reduce the radial temperature difference in the vapor deposition apparatus and improve the heat uniformity of the vapor deposition material in the vapor deposition apparatus.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A vapor deposition apparatus, comprising: a cylindrical heating source, a crucible lid housed in the heating source, a first crucible, a second crucible, a moving part, and a bracket;

the first crucible, the second crucible and the moving part being respectively disposed under the crucible lid; the first crucible being fixed on the bracket; the first crucible and the second crucible each comprising an inner sidewall, an outer sidewall disposed on outside of the inner sidewall, and a bottom connecting the inner sidewall and the outer sidewall and located at an end away from the crucible lid; the crucible lid being mounted on the outer sidewall of the first crucible, and an opening being provided at center of the crucible lid, a gap in vertical direction existing between an end of the inner sidewall of the first crucible near the crucible lid and the crucible lid; height of the outer sidewall of the first crucible being greater than or equal to height of the inner sidewall; the second crucible being fixed to top surface of the moving part; projection of the inner sidewall of the first crucible in vertical direction being located outside the outer sidewall of the second crucible;

the heating source comprising a cylindrical casing and a heating wire sleeved on the casing, the casing having a first region corresponding to position of the crucible lid and the first crucible and a second region located below the first region; density of the heating wire in the first region being greater than the density of the heating wire in the second region;

wherein the vapor deposition apparatus further comprises a third crucible housed in the heating source; the third crucible is disposed under the crucible lid; the third crucible comprises an inner sidewall, an outer sidewall disposed outside the inner sidewall, and a bottom connecting the inner sidewall and the outer sidewall and located at an end away from the crucible lid; the projection of the inner sidewall of the first crucible in vertical direction is located outside the outer sidewall of the third crucible; projection of the inner sidewall of the third crucible in vertical direction is located outside the outer sidewall of the second crucible; a first limiting portion is disposed at bottom portion of inner surface of the inner sidewall of the first crucible, a second limiting portion is disposed at top portion of outer surface of the outer sidewall of the third crucible, projections of the first limiting portion and the second limiting portion in vertical direction at least partially overlap, the first limiting portion is located below the second limiting portion; the bottom portion of the inner surface of the inner sidewall of the third crucible is provided with an elastic limiting unit, projection of the elastic limiting unit in vertical direction at least partially overlaps with projection of the outer sidewall of the second crucible in vertical direction; when a gap existing between an end of the third crucible near the crucible lid and the crucible lid and the outer sidewall of the second crucible is located in below the elastic limiting unit, the moving part is moved upward, the outer sidewall of the second crucible pushes the elastic limiting unit of the third crucible to raise the third crucible; when the end of the third crucible near the crucible lid contacts the crucible lid and the outer sidewall of the second crucible is located below the elastic limiting unit, the moving part is moved upward, and the outer sidewall of the second crucible compresses the elastic limiting unit to move into inside of the inner sidewall of the third crucible.

2. The vapor deposition apparatus as claimed in claim 1, wherein the inner sidewalls and the outer sidewalls of the first crucible and the second crucible are both cylindrical; the axes of the inner sidewall and the outer sidewall of the second crucible are coincident with the axes of the inner sidewall and the outer sidewall of the first crucible.

3. The vapor deposition apparatus as claimed in claim 2, wherein shape of the crucible lid is round.

4. The vapor deposition apparatus as claimed in claim 2, wherein the casing is cylindrical and axis of the casing coincides with the axis of the inner sidewall of the first crucible.

5. The vapor deposition apparatus as claimed in claim 4, wherein the opening is disposed correspondingly to the axis of the inner sidewall of the first crucible.

6. The vapor deposition apparatus as claimed in claim 1, wherein the inner sidewalls and the outer sidewalls of the first crucible, the second crucible and the third crucible are all cylindrical; the axes of the inner sidewall of the outer sidewall of the second crucible, the axes of the inner sidewall and the outer sidewall of the first crucible are coincident with the axes of the inner sidewall and the outer sidewall of the third crucible.

7. The vapor deposition apparatus as claimed in claim 1, wherein a groove is disposed corresponding to the elastic limiting unit at the bottom surface of the inner surface of the inner sidewall of the third crucible; the elastic limiting unit comprises a spring disposed in the corresponding groove and a protruding portion contacting an end of the spring away from bottom of the groove and exposed outside the groove; an end of the protruding portion away from the bottom of the groove is a circular arc surface;

projection of the protruding portion in vertical direction at least partially overlaps with the projection of the outer sidewall of the second crucible in vertical direction; when a gap existing between an end of the third crucible near the crucible lid and the crucible lid and the outer sidewall of the second crucible is located in below the elastic limiting unit, the moving part is moved upward, the outer sidewall of the second crucible pushes the circular arc surface at the end of the protruding portion away from the bottom of the groove to raise the third crucible; when the end of the third crucible near the crucible lid contacts the crucible lid and the outer sidewall of the second crucible is located below the elastic limiting unit, the moving part is moved upward, and the outer sidewall of the second crucible pushes the circular arc surface at the end of the protruding portion away from the bottom of the groove to compresses the spring to move the protruding portion towards the bottom of the groove so that the second crucible moves to inside the inner sidewall of the third crucible.

8. The vapor deposition apparatus as claimed in claim 1, wherein the moving part is a piston, and a lower surface of the piston is provided with a rod.

* * * * *